(12) United States Patent
Vats et al.

(10) Patent No.: US 12,345,764 B2
(45) Date of Patent: Jul. 1, 2025

(54) TEST PATTERN GENERATION USING MULTIPLE SCAN ENABLES

(71) Applicant: STMicroelectronics International N.V., Geneva (CH)

(72) Inventors: Shiv Kumar Vats, Greater Noida (IN); Umesh Chandra Srivastava, Greater Noida (IN); Venkata Narayanan Srinivasan, Greater Noida (IN)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 51 days.

(21) Appl. No.: 18/338,082

(22) Filed: Jun. 20, 2023

(65) Prior Publication Data

US 2024/0426907 A1 Dec. 26, 2024

(51) Int. Cl.
*G01R 31/28* (2006.01)
*G01R 31/3185* (2006.01)

(52) U.S. Cl.
CPC ........... *G01R 31/318536* (2013.01); *G01R 31/318544* (2013.01)

(58) Field of Classification Search
CPC ............. G01R 31/318536; G01R 31/318644
See application file for complete search history.

(56) References Cited

U.S. PATENT DOCUMENTS

| | | | | |
|---|---|---|---|---|
| 5,774,474 A | * | 6/1998 | Narayanan | G01R 31/318555 714/726 |
| 7,739,568 B1 | * | 6/2010 | Bertanzetti | G01R 31/318547 714/814 |
| 7,840,861 B2 | | 11/2010 | Sul | |
| 8,024,631 B1 | * | 9/2011 | Bertanzetti | G01R 31/318547 714/729 |
| 8,055,965 B2 | | 11/2011 | Kaneko | |
| 9,473,121 B1 | * | 10/2016 | Abhishek | G01R 31/318541 |
| 9,529,044 B1 | * | 12/2016 | Taneja | G01R 31/318547 |
| 9,599,672 B2 | | 3/2017 | Abhishek et al. | |
| 9,897,655 B2 | * | 2/2018 | Park | H03K 3/0375 |

(Continued)

OTHER PUBLICATIONS

Ahmed, N. et al., "Local At-Speed Scan Enable Generation for Transition Fault Testing Using Low-Cost Testers," IEEE Transactions on Computer-Aided Design of Integrated Circuits and Systems, vol. 26, No. 5, May 2007, 11 pages.

(Continued)

*Primary Examiner* — Mujtaba M Chaudry
(74) *Attorney, Agent, or Firm* — Slater Matsil, LLP (57) ABSTRACT

An integrated circuit includes a first set and a second set of scan flip flops, a circuit under test, and a controller. Each scan flip flop of the first set includes a scan enable input coupled to a first scan enable signal. The circuit under test includes logic elements downstream of the first set. The second set includes at least one scan flip flop downstream of the logic elements. Each scan flip flop of the second set includes a scan enable input coupled to a second scan enable signal. The controller is configured to test the logic elements by shifting test patterns into the first set while asserting both the first and second scan enable signal, launching the test patterns, and capturing results from the second set while continuing to assert the first scan enable signal and deasserting the second scan enable signal.

20 Claims, 6 Drawing Sheets

(56) References Cited

U.S. PATENT DOCUMENTS

| | | |
|---|---|---|
| 9,915,933 B2 | 3/2018 | Kim |
| 11,604,221 B1 | 3/2023 | Pradeep et al. |
| 2011/0078524 A1* | 3/2011 | Saxena .......... G01R 31/318575 |
| | | 714/E11.144 |
| 2011/0145666 A1* | 6/2011 | Whetsel ........... G01R 31/31723 |
| | | 714/E11.144 |
| 2013/0055041 A1* | 2/2013 | Tekumalla ..... G01R 31/318544 |
| | | 714/E11.155 |
| 2017/0269158 A1* | 9/2017 | Whetsel ........... G01R 31/31721 |
| 2018/0031631 A1 | 2/2018 | Srinivasan et al. |
| 2021/0294398 A1* | 9/2021 | Jain ....................... G06F 1/3203 |
| 2022/0244308 A1 | 8/2022 | Srinivasan et al. |

OTHER PUBLICATIONS

Extended European Search Report, EP Application No. 24179385.0-1001, mailed Nov. 29, 2024, 7 pages.

* cited by examiner

TEST PATTERN GENERATION USING MULTIPLE SCAN ENABLES

TECHNICAL FIELD

The present invention relates generally to test pattern generation for the testing of integrated circuits, and, in particular embodiments, to structures of integrated circuits with design for testability functionality implemented with scan chains, and methods of operation thereof.

BACKGROUND

With the rapid increase in the quantity of circuit elements in integrated circuits and the equally rapid decrease in the size of these circuit element, developing efficient and effective testing methods for integrated circuits has become more and more important. Additionally, more and more elements of integrated circuits are becoming internal and the number of logic level are increasing (e.g., in complex implementations such as a system on a chip (SoC)). Automatic test pattern generation (ATPG) can be used to improve testing efficiency as well as test coverage of possible faults. However, the sheer magnitude and complexity of modern integrated circuits increases the pattern count and the test time.

Many different types of faults must be tested for in order to ensure reliable operation of the integrated circuit. One particular category of faults involving signal timing includes faults such as path delay faults and transition delay faults. Because identifying timing faults depends on the system timing, these faults must be tested at system speeds. Such "at-speed testing" launches test patterns along a path (e.g. through combinational logic that is being tested) and captures the result after a time defined by system timing (e.g. one or more system clock cycles).

Before launching, the test pattern is shifted into test registers (e.g., scan flip flops that are configured to operate in either functional mode or scan mode depending on the signal received at a scan enable input). During the shift, the scan flip flops are operating in scan mode. Prior to capture, the scan flip flops must be in functional mode, which can create timing issues for the transition of the scan enable signal. There are two basic methods of ensuring that the scan enable signal fully transitions between the last shift and the capture: the launch-off-capture (LOC) method and the launch-off-shift (LOS) method.

In the LOC method, there is a dead cycle after the last shift to allow the scan enable signal to transition at a slower speed than the system clock. This allows the test clock (used for shift pulses) to be at a lower speed than the system clock. However, LOC sacrifices control because the scan enable signal transitions the scan flip flops to functional mode (capture mode) before the launch pulse. As a result, the launch is based off of functional logic causing the ATPG patterns to be sequential, which increases pattern count.

On the other hand, the LOS method launches the pattern on the last shift, requiring the scan enable signal to transition between the launch pulse and the capture pulse (two at-speed pulses). In contrast to LOC, the scan enable signal keeps the scan flip flops in scan mode (launch mode) during the launch pulse in LOS. This affords more control, but has stringent timing requirements that can be difficult or impossible to meet. Therefore, an at-speed testing method that reduces the pattern count compared to LOC without the stringent timing requirements of LOS may be desirable.

SUMMARY

In accordance with an embodiment of the invention, an integrated circuit includes a first set of scan flip flops, a circuit under test, a second set of scan flip flops, and a controller. Each of the scan flip flops of the first set includes a scan enable input coupled to a first scan enable signal. A circuit under test includes logic elements downstream of the first set of scan flip flops. The second set of scan flip flops includes at least one scan flip flop downstream of the logic elements. Each of the scan flip flops of the second set includes a scan enable input coupled to a second scan enable signal. The controller is configured to test the logic elements by shifting test patterns into the first set while asserting both the first scan enable signal and the second scan enable signal, launching the test patterns, and capturing results from the second set while continuing to assert the first scan enable signal and deasserting the second scan enable signal.

In accordance with another embodiment of the invention, an integrated circuit includes a circuit under test including initiator logic elements and target logic elements, a first scan chain of scan flip flops including the initiator logic elements, a second scan chain of scan flip flops including the target logic elements, and a controller configured to test the circuit under test. Each scan flip flop of the first scan chain includes a scan enable input coupled to a first scan enable signal. Each of the scan flip flops of the second scan chain includes a scan enable input coupled to a second scan enable signal. The controller is configured to test the circuit under test by shifting a first test pattern into the first scan chain while both the initiator logic elements and the target logic elements are operating in launch mode, launching the first test pattern, and capturing results from the second scan chain while the initiator logic elements are operating in launch mode and the target logic elements are operating in capture mode.

In accordance with still another embodiment of the invention, a method of testing an integrated circuit includes shifting a first test pattern into a first set of scan flip flops of the integrated circuit upstream of first logic elements of the integrated circuit while asserting both a first scan enable signal and a second scan enable signal. Each of the scan flip flops of the first set include a scan enable input coupled to the first scan enable signal. The method further includes deasserting the second scan enable signal while continuing to assert the first scan enable signal, launching the first test pattern, and capturing results from a second set of scan flip flops of the integrated circuit downstream of the first logic elements while the first scan enable signal is asserted and the second scan enable signal is deasserted. Each of the scan flip flops of the second set include a scan enable input coupled to the second scan enable signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

As electronic circuits (e.g., integrated circuits such as SoCs) grow in size and become more complex (e.g., with increased logic levels), the number of test patterns needed to test the electronic circuits increases. This increase in pattern count results in a corresponding increase in test time. At the same time, there is also a decrease in the test coverage (e.g., DFT coverage) due to poor controllability of conventional at-speed testing methodologies. The increased circuit complexity also leads to physical design constraints in order to meet high fanout non-functional paths at-speed which can further reduce test coverage. These issues become more and more important as the size and complexity of integrated circuits, such as SoCs, increases.

While DFT tools are also getting more advanced, there are still many times where tool limitations are reached regarding high pattern count and huge pattern generation time. Designs using the LOC approach to launch and capture have a higher pattern count due to reduced control while the LOS approach has a stringent (frequently infeasible) timing requirement. Power consumption is another area that can affect pattern count. For example, the dependency on the tool to reduce the capture power can also result in heavy pattern inflation. Therefore, there is a recognized problem that although current DFT tools are advanced, there are still undesirable limitations. So, methods that are both timing friendly and that also reduce the pattern count are desirable.

Conventional solutions to pattern generation are the LOC and the LOS methods. In LOS, the scan enable signal is high (i.e. the scan flip flops are in scan mode) between the launch pulse and the capture pulse. The scan enable signal will transition to low (functional mode) between the launch pulse and the capture pulse (the strict at-speed timing requirement), but the scan enable signal is asserted during launch (based on the scan input (SI input) of a scan flip flop). This allows more control over downstream logic allowing the tool to generate patterns easier and pattern count is reduced. However, the at-speed clock (e.g. the system clock), that defines the duration between the launch pulse and the capture pulse, may be very high relative to the test clock (e.g. a 1 GHz system clock requiring less than 1 ns transition compared to a 50 MHz test clock). It can be very difficult or impossible to meet this transition timing requirement on the scan enable path (e.g., because of high fan out transitioning). For this reason, the conventional LOS method is not feasible in many circumstances.

The LOC method avoids the timing requirements on the scan enable path by generating patterns that allow transitioning the scan enable signal to low prior to the launch pulse during a dead test cycle (or more than one). Because the scan enable signal is low (functional mode) during the launch pulse, the launch is based on functional logic (e.g. a functional input (D input) of a scan flip flop). This control using only upstream logic limits the ability of target faults, such as path delay faults and transition delay faults. Downstream logic will be captured at a functional input of another scan flip flop. Because of the reliance on upstream functional logic to control downstream logic, the conventional LOC method decreases tool flexibility and increases the pattern count which in turn reduces coverage. That is conventional LOC has limitations due to increased pattern count and reduced DFT coverage.

In various embodiments, the integrated circuits with DFT functionality described herein include separate scan enables simultaneously used during the launch and capture of a test pattern. For example, a first set of scan flip flops is coupled to a first scan enable signal while a second set of scan flip flops is coupled to a second scan enable signal. The sets of scan flip flops may be chosen based on knowledge of a given design (e.g., by identifying similarly situated elements as initiators or targets in the testing of certain logic elements). Alternatively, some or all of the sets of scan flip flops may be connected without considering design details (e.g., according to a script during scan insertion).

A controller (internal or external) may be configured to test logic elements by shifting in a test pattern while the scan flip flops are in scan mode (launch mode). For example, the first scan enable signal and the second scan enable signal may be asserted while shifting in the test pattern. The controller also may be configured to launch the test pattern and capture the results from the second set of scan flip flops while the second set is in functional mode (capture mode) and the first set remains in scan mode (launch mode). For example, the second scan enable signal may be deasserted and the first scan enable signal may be asserted.

The embodiments described herein may reduce or eliminate the previously discussed disadvantages of conventional pattern generation methods. For example, the embodiment integrated circuits may provide efficient scan methods by ensuring pattern count reduction to reduce test time (e.g. compared with conventional LOC methods) while simultaneously avoiding stringent timing requirements on scan enable paths (e.g., compared with conventional LOS methods). In other words, the embodiment launch and capture methods and corresponding integrated circuits described herein may advantageously provide the benefits of conventional LOS and LOC while reducing or removing their disadvantages.

The embodiments described herein may also advantageously be implemented in any project with scan implementation, such as an SoC or other integrated circuit. Various embodiments, such as those that take the specifics of a given design into consideration during scan insertion, may be beneficial for use in future designs while some embodiments, such as those that use tool options for scan insertion without considering deign specifics may have the advantage of being immediately used in current devices as well as in future devices.

Figure 1:
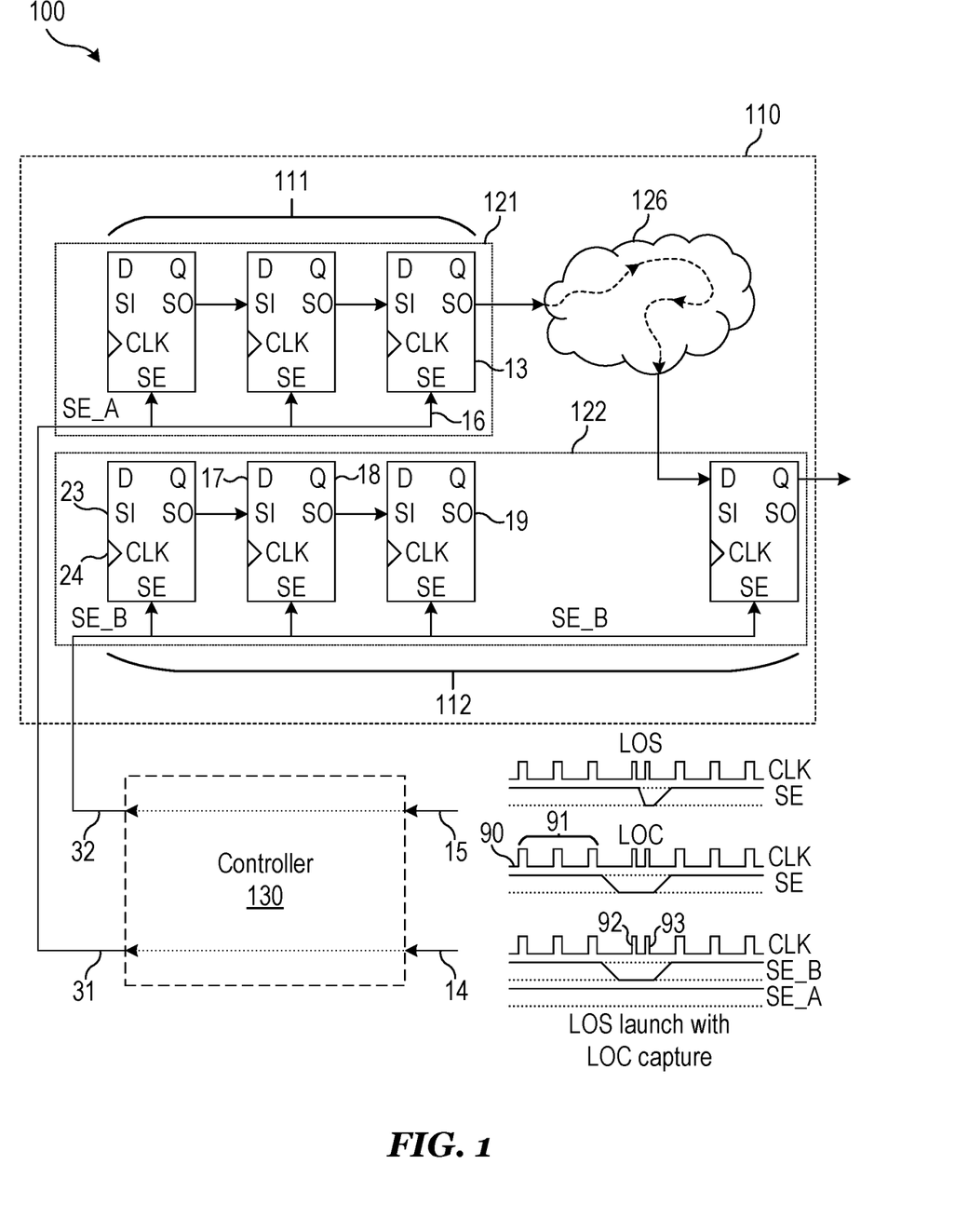
FIG. 1 illustrates an example integrated circuit with DFT functionality including a first set of scan flip flops coupled to a first scan enable signal and a second set of scan flip flops coupled to a second scan enable signal in accordance with embodiments of the invention.

Embodiments provided below describe various integrated circuits with DFT functionality, and in particular, DFT functionality that includes a set of scan flip flops coupled to a scan enable signal asserted during shift and deasserted during capture, and that includes another set of scan flip flops coupled to a different scan enable signal asserted during both shift and capture. The following description describes the embodiments. FIG. 1 is used to describe an example integrated circuit. An example integrated circuit with a circuit under test that includes a FIFO circuit is described using FIG. 2. Two example integrated circuits with a controller configured to simultaneously drive a first scan enable signal and a second scan enable signal are described using FIGS. 3 and 4. Another integrated circuit is described using FIG. 5. Another example integrated circuit with a circuit under test that includes a FIFO circuit is described using FIG. 6. An example scan flip flop is described using FIG. 7. An example method of testing an integrated circuit is described using FIG. 8.

FIG. 1 illustrates an example integrated circuit with DFT functionality including a first set of scan flip flops coupled to a first scan enable signal and a second set of scan flip flops coupled to a second scan enable signal in accordance with embodiments of the invention.

Referring to FIG. 1, an integrated circuit 100 includes a circuit under test 110, a first set of scan flip flops 111 and a second set of scan flip flops 112. The circuit under test 110 includes logic elements 126 that are to be tested using the first set of scan flip flops 111 and the second set of scan flip flops 112. The circuit under test 110 may be any circuit that includes logic elements, such as a FIFO circuit, Joint Test Action Group (JTAG) state machine, memory circuit, bus registers and peripheral read/write registers, and the like. The circuit under test 110 may include various combinations of combinational logic elements and sequential logic elements.

The first set of scan flip flops 111 may be similarly situated within the design. For example, the first set of scan flip flops 111 may be initiator logic elements with respect to the logic elements 126 (e.g., located upstream of the logic elements 126). Similarly, the second set of scan flip flops 112 may be target logic elements with respect to the logic elements 126 (e.g., located downstream of the logic elements 126). In various embodiments, the first set of scan flip flops 111 and the second set of scan flip flops 112 are sequential logic elements coupled to combinational logic elements of the logic elements 126. The first set of scan flip flops 111 may be (or be part of) a first scan chain 121 (e.g. of initiator logic elements) while the second set of scan flip flops 112 may be (or be part of) a second scan chain 122 (e.g. of target logic elements separate from the first scan chain 121), as shown. Alternatively, one or more scan flip flops with different scan enable signals may be part of the same chain (i.e. a mixed chain).

Some or all of the scan flip flops may have a function during normal operation in addition to a test function as part of a scan chain. For example, when the circuit under test 110 includes a FIFO circuit, the first set of scan flip flops 111 may be configured to write to the FIFO circuit (and read from the FIFO) and second set of scan flip flops 112 may include a FIFO shift register (functional logic). As another example, when the circuit under test 110 includes a JTAG state machine, the first set of scan flip flops 111 may include a common data shift register while the second set of scan flip flops 112 may include multiple test data registers.

In another example, when the circuit under test 110 includes a memory circuit, the first set of scan flip flops 111 may be configured to write (and/or read) from memory cells of the memory circuit (e.g., a BIST) while the second set of scan flip flops 112 may include the memory cells (e.g., bits). In yet another example, when the circuit under test 110 includes a bus interface and a peripheral interface, the first set of scan flip flops 111 may include the bus interface and the second set of scan flip flops 112 may include the peripheral interface.

Each scan flip flop 13 includes a functional input 17 (D input) and a functional output 18 (Q output). In addition, each scan flip flop 13 includes a scan input 23 (SI input) and a scan output 19 (SO output). Specifically, a scan enable input 16 (SE input) of each scan flip flop 13 selects between the functional input 17 and the scan input 23. Conceptually, the scan flip flop 13 is shown to have two separate outputs. However, in practice the scan flip flop 13 may have only one output (Q output) to which the selected input (functional input 17 or scan input 23) is propagated with pulses to a clock input 24 (CLK input).

The logic elements 126 are located downstream of the first set of scan flip flops 111. In one embodiment, the logic elements 126 are combinational logic elements. The logic elements 126 may also be a single logic element (such as a single logic gate, etc.). At least one of the second set of scan flip flops 112 is located downstream of the logic elements 126, as shown.

The integrated circuit 100 includes a first scan enable signal 31 and a second scan enable signal 32 that are separately controllable. The scan enable input 16 of each of the scan flip flops of the first set of scan flip flops 111 is coupled to the first scan enable signal 31 while the scan enable input 16 of each of the second set of scan flip flops 112 is coupled to the second scan enable signal 32.

The first scan enable signal 31 (shown as SE_A) and the second scan enable signal 32 (shown as SE_B) may be coupled to dedicated external connections, such as a first test pin 14 and second test pin 15, as shown. For example, the first test pin 14 and the second test pin 15 may be test pads of the integrated circuit 100. In this way, the first scan enable signal 31 and the second scan enable signal 32 may be controlled externally (e.g., entirely by external test equipment). Alternatively, the first test pin 14 and the second test pin 15 may be combined into a single external connection (e.g., test pin/pad), or the first scan enable signal 31 and the second scan enable signal 32 may be controlled entirely internally (as in logic built-in self-test (LBIST), for example). The first scan enable signal 31 and the second scan enable signal 32 may be dynamically toggled by the tool during testing.

A controller 130 may be included to control some or all aspects of the shift, launch, and capture phases of the testing process. For example, the controller 130 may be configured to control timing and transitions of the first scan enable signal 31 and the second scan enable signal 32. In the case where the first scan enable signal 31 and the second scan enable signal 32 are separate and externally provided, the controller 130 may be configured to control the generation of testing pulses, such as shift pulses 91, a launch pulse 92, and a capture pulse 93 for each test pattern. The test pulses may also be externally driven, (which may be made possible by the relaxed timing requirements when compared to the stringent timing requirements of conventional LOS, for example).

When the first scan enable signal 31 and the second scan enable signal 32 are combined (whether as a single external connection or as a single internal connection), the controller 130 may be configured to control the first scan enable signal 31 and the second scan enable signal 32 using, for example, a combination of scan flip flops, logic gates, multiplexers, and/or inverters. These scan flip flops may be part of one or more scan chains (e.g., a control scan chain) to facilitate control over the first scan enable signal 31 and the second scan enable signal 32. The controller 130 may also be configured to test the logic elements 126 by shifting test patterns into the scan flip flops, launching the test patterns, and capturing results from the scan flip flops.

The partitioning of the scan flip flops into separate groups connected to separate scan enables may allow advantageous timing attributes during shift, launch, and capture. For example, a test pattern may be shifted into the scan flip flops (e.g., the first set of scan flip flops 111 while both the first scan enable signal 31 and the second scan enable signal 32 are asserted (e.g., high "1") placing the first set of scan flip flops 111 and the second set of scan flip flops 112 in scan mode (launch mode).

Because there are two separate scan enable signals, the second scan enable signal 32 can be deasserted (e.g., low "0") prior to the launch pulse 92 placing the second set of scan flip flops 112 in functional mode (capture mode) and the test pattern can be launched with the first set of scan flip flops 111 (upstream scan flip flops, the initiator logic elements, for example) in launch mode. The results can then be captured from one or more of the second set of scan flip flops 112 in capture mode (downstream of the logic elements 126, the target logic elements, for example). Thus, the launch advantage and corresponding flexibility and pattern reduction benefits over conventional LOC are obtained without the stringent timing requirements of conventional LOS. Additionally, the ability to launch with upstream flip flops in launch mode may advantageously allow the test patterns to be only combinational test patterns which may reduce pattern count.

When the first set of scan flip flops 111 and the second set of scan flip flops 112 are selected based on design knowledge a greater pattern reduction may advantageously be gained. For example, using design knowledge (e.g. by reading an analyzed the design), initiator and target logics may be separated into different partitions at the register transfer level (RTL) scan insertion level and different scan enable signals may be connected to them, (either external or internal). The scan flip flops can be inserted as different scan chains (as shown). This may be suitable for first device iterations (e.g. of a product family)/first cut of a product because partitioning is possible.

Various criteria may be used to divide the logic of a given design in categories for the connection of different scan enable signals. For example, similar types of logic may be grouped, spatially or functionally similar logic may be grouped (e.g., blocks of logic), etc. In some cases, the categorizing by type of logic may provide better coverage because similarly situated scan flip flops will be connected to the same scan enable signal. In some cases, tools can be designed to stitch related logic into single scan chain based on their clock and hierarchy. For example, master (e.g. initiator) logic elements and slave (e.g. target) logic elements may already be placed in different hierarchies, allowing the separate scan enable signals to be connected to already existing scan chains.

With the initiator/target method, the tool can advantageously always (or at least the majority of the time) launch similar to LOS and capture similar to LOC which may providing more coverage for the same pattern count then conventional LOC and the scan enable path is constant between the launch pulse 92 and the capture pulse 93 (there is no scan enable toggle between two at-speed pulses as in LOS).

Alternatively, (as discussed in more detailed in FIGS. 5-7) some or all of the scan flip flops can be connected without considering the design and the tool can use launch similar to LOS with capture similar to LOC when possible and conventional LOC otherwise. This still may have the benefit of providing more coverage for the same pattern count then using only conventional LOC and the scan enable path still remains constant between the launch pulse 92 and the capture pulse 93. Compared to the initiator/target method, the mixed method may take slightly more patterns for the same coverage, but doesn't require any design knowledge. Therefore, the decision of how to connect the separate scan enable signals is a choice that may be made by according to the specific requirements of a given application.

Timing diagrams showing a clock signal 90 and a corresponding scan enable signal for conventional LOS and conventional LOC are provided for comparison with the embodiments described herein, that use multiple (e.g., two) scan enable signals to launch similar to LOS while capturing similar to LOC. As shown, shifting a test pattern uses test clock pulses (shift pulses 91, at a slower clock than the system clock) and launching the test pattern and capturing the results uses two at-speed pulses (the launch pulse 92 and the capture pulse 93, faster than the test clock, and can be as fast as the system clock).

In LOS, the scan enable signal is high during the launch pulse 92, but the fall time (plus logic settle time) of the scan enable path must be shorter than the time between the launch pulse 92 and the capture pulse 93 (as short as 1 ns or even faster). In LOC, there is a delay between the last of the shift pulses 91 and the launch pulse 92 to allow the scan enable signal to transition, but the scan enable signal is low during the launch pulse 92. In contrast, when two scan enable signals (SE_A and SE_B) are used, the scan enable signal for the upstream scan flip flops (first scan enable signal 31, SE_A) is high during the launch pulse 92 and the scan enable signal for the scan flip flops used for capture (downstream scan flip flops) is low during the capture pulse 93 while still allowing for a delay between the last of the shift pulses 91 and the launch pulse 92.

The role of the sets of scan flip flops (e.g., initiator versus target) may switch depending on the specifics of what is being tested. In one specific example, when memory is being tested, both read and write are tested. To test write functionality, initiator logic that is configured to write to the memory (e.g. a BIST) may play the initiator role while the memory itself (memory cells) may play the target role.

However, to test read functionality, the memory may play the initiator role while the BIST plays the target role. In this case, the timing diagrams for the SE_A and SE_B signals would be switched because the roles are switched. That is, what was upstream for the write test is now downstream and so SE_A would be made low prior the launch pulse 92 and SE_B would remain high. That is, the initiator logic elements and the target logic elements would both be in launch mode during shift, and the initiator logic elements would be transitioned to capture mode prior to launch and be in capture mode during capture while the target logic elements continue operating in launch mode.

Figure 2:
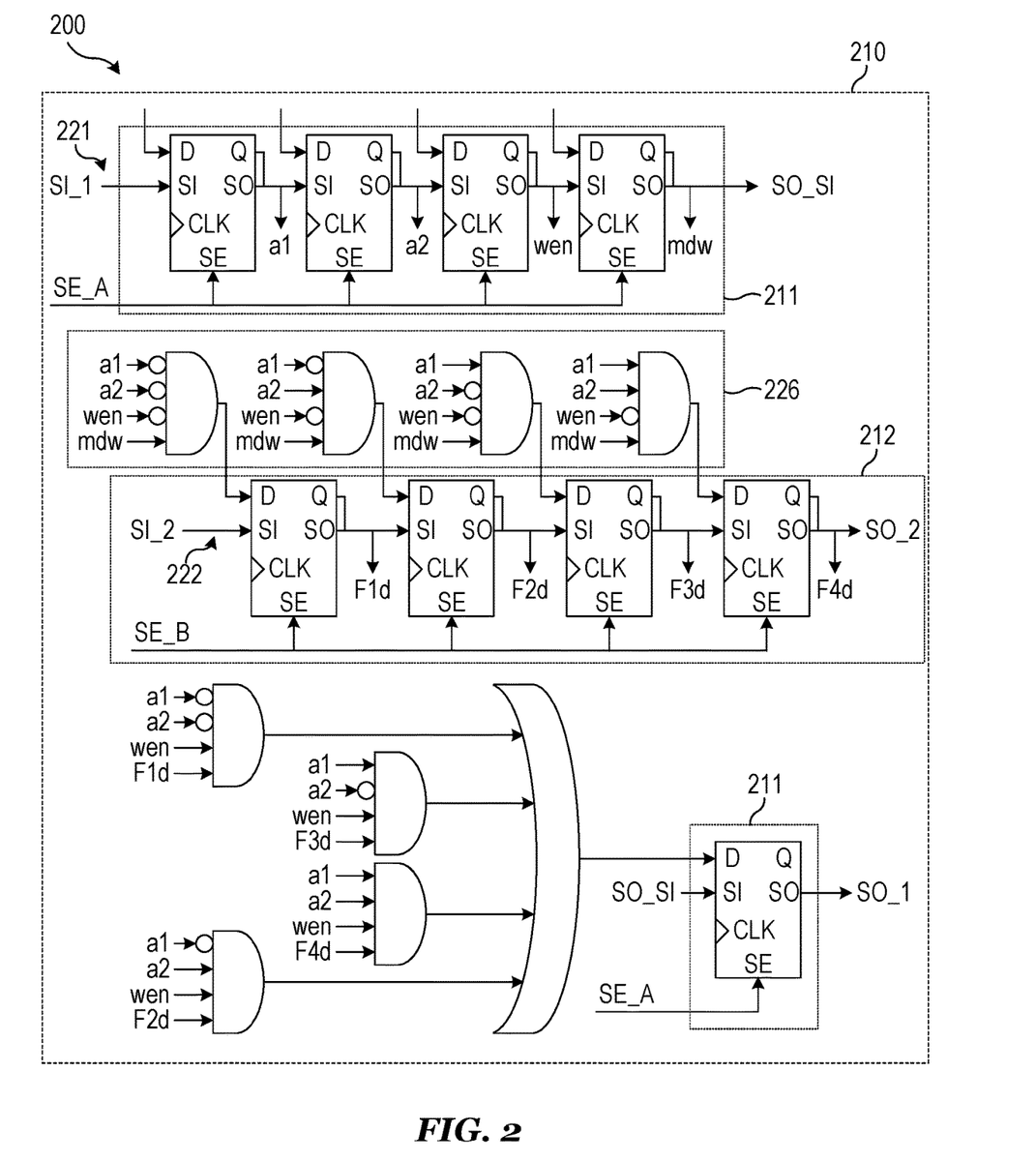
FIG. 2 illustrates another example integrated circuit with DFT functionality including a first scan chain coupled to a first scan enable signal and a second scan chain coupled to a second scan enable signal where the integrated circuit includes a first in, first out circuit in accordance with embodiments of the invention.

FIG. 2 illustrates another example integrated circuit with DFT functionality including a first scan chain coupled to a first scan enable signal and a second scan chain coupled to a second scan enable signal where the integrated circuit includes a FIFO circuit in accordance with embodiments of the invention. The integrated circuit of FIG. 2 may be a specific implementation of other integrated circuits described herein such as the integrated circuit of FIG. 1, for example. Similarly labeled elements may be as previously described.

Referring to FIG. 2, an integrated circuit 200 includes a circuit under test 210 that includes a FIFO circuit. It should be noted that here and in the following a convention has been adopted for brevity and clarity wherein elements adhering to the pattern [x10] where 'x' is the figure number may be related implementations of a circuit under test in various embodiments. For example, the circuit under test 210 may be similar to the circuit under test 110 except as otherwise stated. An analogous convention has also been adopted for other elements as made clear by the use of similar terms in conjunction with the aforementioned numbering system.

In this specific example, the circuit under test 210 includes a FIFO circuit and includes a first scan chain 221 selected as a first category (initiator logic) in the circuit under test 210 that is configured to write to the FIFO circuit (and read from the FIFO), and a second scan chain 222 selected as a second category (target logic) in the circuit under test 210 that includes a shift register (i.e. functional logic) of the FIFO circuit. In particular, a first set of scan flip flops 211 is coupled to the first scan enable signal 31 and a second set of scan flip flops 212 is coupled to the second scan enable signal 32 (shown here as the first scan chain 221 and the second scan chain 222 but may also include additional scan flip flops as part of the same scan chain or a different scan chain).

Here, SE_A (the first scan enable signal 31) can be made high during launch so that the launch is through the SI input of the first scan chain 221 (similar to LOS). There is no control limitation as with conventional LOC because the upstream scan flip flops are coupled to SE_A, which remains '1'. That is, the values of the test pattern are directly driven as they are in shift.

On the other hand, SE_B (the second scan enable signal 32) is made low during capture, but is not subject to the timing restrictions of conventional LOS because a delay (e.g., one or more empty test cycles) may be included between the last shift and the launch pulse. So, the functional outputs (Q output) of the second scan chain 222 are captured during the capture pulse. SE_B does not need to be high during launch to launch through the SI inputs because the launch is from the first scan chain 221 coupled to SE_A.

The first scan enable signal 31 and the second scan enable signal 32 may be driven from a controller. Controller scan flip flops may be part of yet another scan chain. Logic elements 226 of the FIFO circuit are tested using the first scan chain 221 and the second scan chain 222. For example, as shown here, the logic elements 226 may include combinational logic. Scan flip flops in the first scan chain 221 are located upstream of the logic elements 226 while scan flip flops of the second scan chain 222 are located downstream of the logic elements 226.

Figure 3:
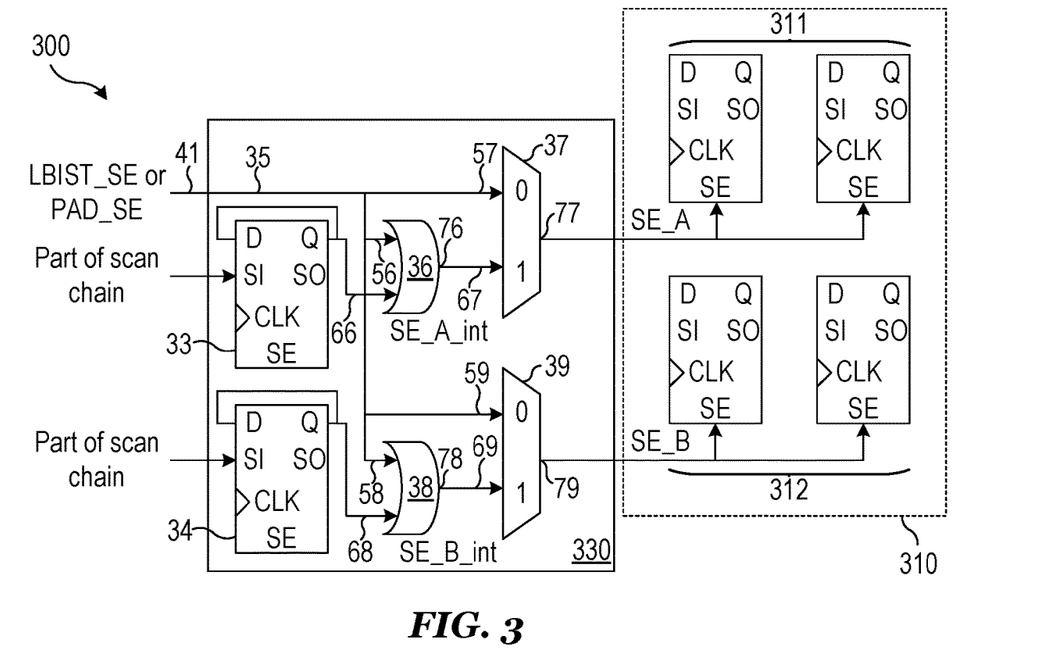
FIG. 3 illustrates an example integrated circuit with DFT functionality including a controller having a scan enable input that controls a first scan enable signal coupled to a first set of scan flip flops and also controls a second scan enable signal coupled to a second set of scan flip flops in accordance with embodiments of the invention.

FIG. 3 illustrates an example integrated circuit with DFT functionality including a controller having a scan enable input that controls a first scan enable signal coupled to a first set of scan flip flops and also controls a second scan enable signal coupled to a second set of scan flip flops in accordance with embodiments of the invention. The integrated circuit of FIG. 3 may be a specific implementation of other integrated circuits described herein such as the integrated circuit of FIG. 1, for example. Similarly labeled elements may be as previously described.

Referring to FIG. 3, an integrated circuit 300 includes a circuit under test 310 including a first set of scan flip flops 311 coupled to a first scan enable signal 31 (SE_A), and a second set of scan flip flops 312 coupled to a second scan enable signal 32 (SE_B). The integrated circuit 300 also includes a controller 330 that is configured to simultaneously drive both SE_A and SE_B using a combined test pin 41. It should be noted that the combined test pin 41 may be an external connection (such as a test pad), but may also be an internal connection (such as an LBIST circuit). The use of the combined test pin 41 may be advantageous in applications with pin limitations, for example. In contrast to embodiments using separate pins, both the first scan enable signal 31 and the second scan enable signal 32 can be controlled using the combined test pin 41 by reading from internal scan flip flops.

The controller 330 includes a scan enable input 35 that is coupled to the combined test pin 41. The first scan enable signal 31 is coupled to an output 77 of a first scan enable multiplexer 37 while the second scan enable signal 32 is coupled to an output 79 of a second scan enable multiplexer 39. The first scan enable multiplexer 37 and the second scan enable multiplexer 39 are used to select between outputs of internal scan flip flop(s) or the scan enable input 35, which is coupled to both a first input 57 of the first scan enable multiplexer 37 and the a first input 59 of the second scan enable multiplexer 39. Selection of the first scan enable multiplexer 37 and the second scan enable multiplexer 39 may be controlled using a test control unit (TCU) bit (tcu_bit_0).

The scan enable input 35 is also coupled to a first input 56 of a first OR gate 36 and a first input 58 of a second OR gate 38. Intermediate scan enable signals (SE_A_int and SE_B_int) are generated by the OR gates at output 76 and output 78, respectively. Additional inputs (a second input 66 and a second input 68) of the OR gates are connected to internal scan flip flops to provide control to the controller 330.

For example, as shown here, the output (Q) of a first controller scan flip flop 33 may be coupled to the second input 66 of the first OR gate 36 and the output (Q) of a second controller scan flip flop 34 may be coupled to second input 68 of the second OR gate 38. The outputs of the first controller scan flip flop 33 and the second controller scan flip flop 34 may be coupled to their respective functional inputs (D). The first controller scan flip flop 33 and the second controller scan flip flop 34 may be part of internal scan chains. Alternatively, (as discussed in reference to FIG. 4) a single controller scan flip flop can also be used instead of the two shown here.

When the scan enable input 35 is '1', both the first scan enable signal 31 and the second scan enable signal 32 are '1' due to the OR logic of the first OR gate 36 and the second OR gate 38. However, when the scan enable input 35 is '0', all four options ('00', '01', '10', '11') are possible. In this way, the controller 330 can be configured to simultaneously drive the first scan enable signal 31 and second scan enable signal 32 to test logic elements by controlling the transition between, for example asserting both the first scan enable signal 31 and the second scan enable signal 32 during shift and deasserting only one (or even both) during launch and/or capture. This allows the previously discussed launch and capture timing, as well as other timings which may be apparent to those of skill in the art.

Figure 4:
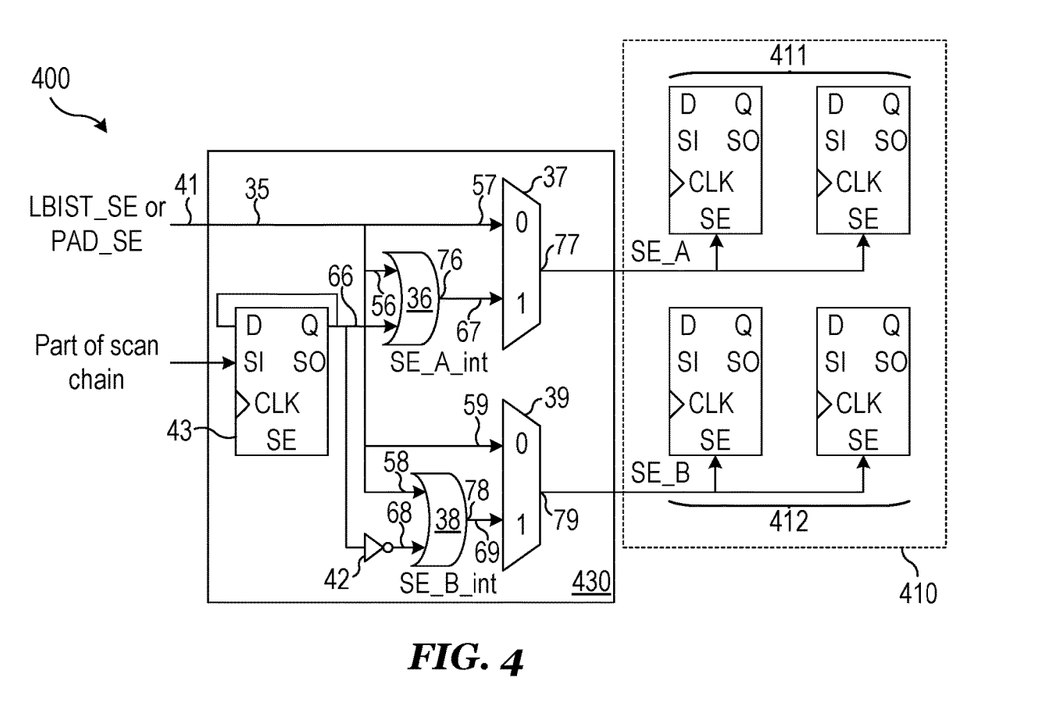
FIG. 4 illustrates another example integrated circuit with DFT functionality including a controller having a scan enable input that controls a first scan enable signal coupled to a first set of scan flip flops and also controls a second scan enable signal coupled to a second set of scan flip flops in accordance with embodiments of the invention.

FIG. 4 illustrates another example integrated circuit with DFT functionality including a controller having a scan enable input that controls a first scan enable signal coupled to a first set of scan flip flops and also controls a second scan enable signal coupled to a second set of scan flip flops in accordance with embodiments of the invention. The integrated circuit of FIG. 4 may be a specific implementation of other integrated circuits described herein such as the integrated circuit of FIG. 1, for example. Similarly labeled elements may be as previously described.

Referring to FIG. 4, an integrated circuit 400 includes a circuit under test 410 including a first set of scan flip flops 411 and a second set of scan flip flops 412 similar to the integrated circuit 300. Also similar to integrated circuit 300, the integrated circuit 400 includes a controller 430 with a scan enable input 35 that is coupled to the combined test pin 41 and at outputs delivering at least two scan enable signals (here, the first scan enable signal 31 and the second scan enable signal 32) to sets of scan flip flops. However, in contrast to the controller 330, the controller 430 includes a combined controller scan flip flop 43 with an output (Q) coupled to both the second input 66 of the first OR gate 36 and to an inverter 42 that is coupled to the second input 68 of the second OR gate 38.

The controller 430 is functionally similar to the controller 330 implementation. For example, when the scan enable input 35 is '1', both the first scan enable signal 31 and the second scan enable signal 32 are still '1' due to the OR logic of the first OR gate 36 and the second OR gate 38. But, different from the controller 430, when the scan enable input 35 is '0', only two options ('01', '10') are possible because of the inverter 42. This may be considered a minor different since the '11' state is still available with the scan enable input 35 is '1'. At any rate, the controller 430 can also be configured to simultaneously drive the first scan enable signal 31 and second scan enable signal 32 to test logic elements by controlling the transition between, for example asserting both the first scan enable signal 31 and the second scan enable signal 32 during shift and deasserting one of the two during launch and/or capture.

In comparison to the two scan flip flop implementation of the controller 330, the combined scan flip flop implementation of controller 430 may have a slightly higher pattern count while still maintaining a lower pattern count advantage over conventional methods.

The controller implementations of FIGS. 3 and 4 may be useful for low pin count applications. The connections between the scan flip flops in each set have been intentionally omitted because the controller 330 and the controller 430 may be used to control the first scan enable signal 31 and the second scan enable signal 32 regardless of the specific method of grouping scan flip flops in the circuit under test (e.g., considering design in an initiator/target configuration, without considering design according to a scripted rule, or some combination thereof).

Figure 5:
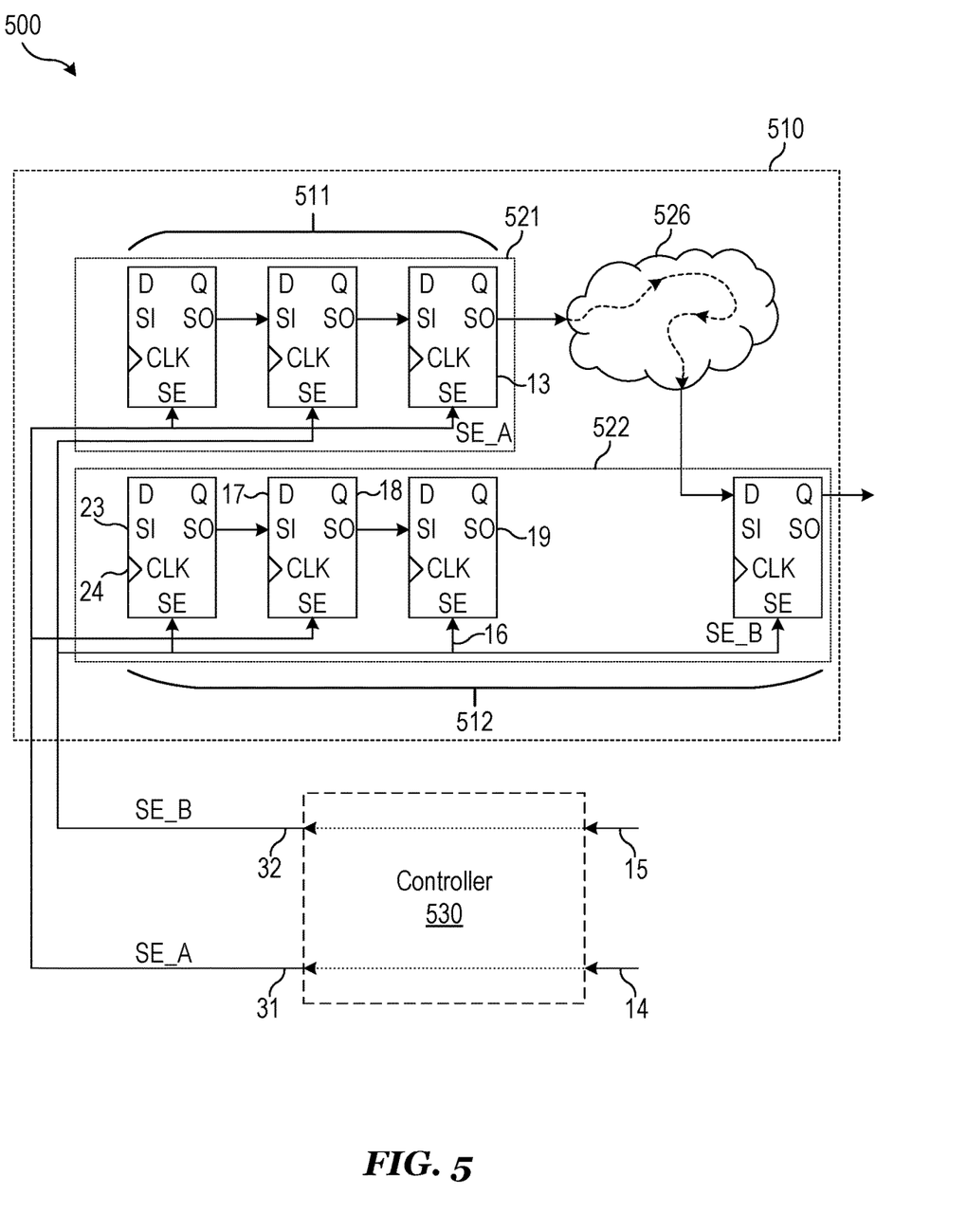
FIG. 5 illustrates an example integrated circuit with DFT functionality including a first set of scan flip flops coupled to a first scan enable signal and a second set of scan flip flops coupled to a second scan enable signal in accordance with embodiments of the invention.
Figure 6:
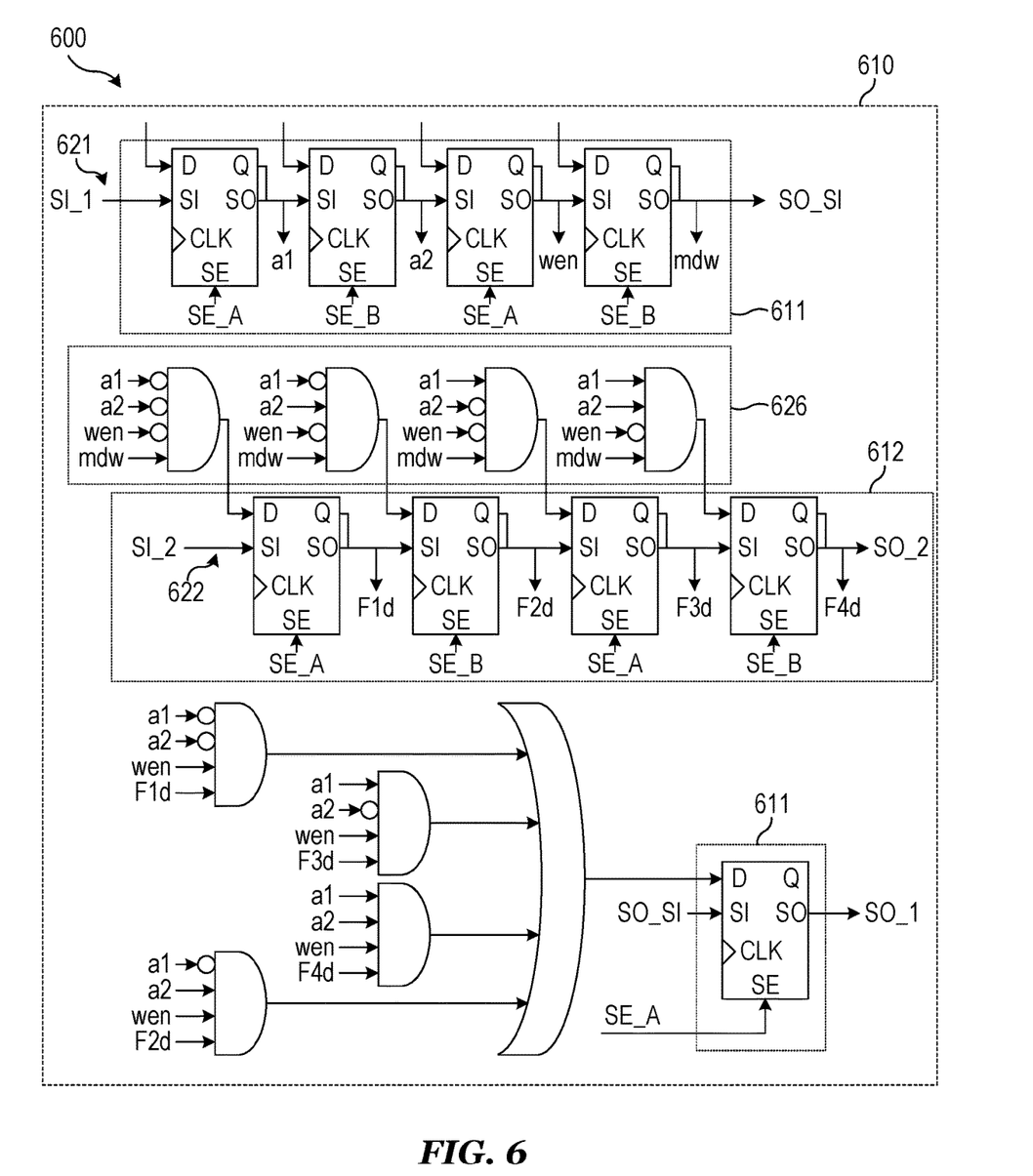
FIG. 6 illustrates another example integrated circuit with DFT functionality including a first set of scan flip flops coupled to a first scan enable signal and a second set of scan flip flops coupled to a second scan enable signal where the integrated circuit includes a first in, first out circuit in accordance with embodiments of the invention.
Figure 7:
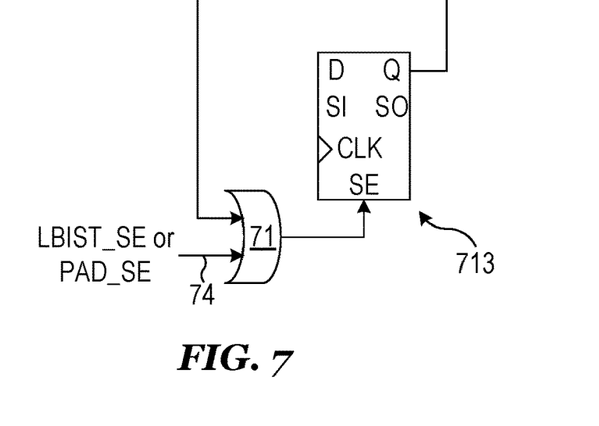
FIG. 7 illustrates an example scan flip flop of an integrated circuit with DFT functionality where the scan flip flop has a localized scan enable in accordance with embodiments of the invention.

In the foregoing examples, separate scan enable signals may be connected to sets (e.g., scan chains) of scan flip flops based on role/situation/location within the design. However, the possibility of connecting separate scan enable signals to sets of flip flops without regard for the specifics of the design was also mentioned. FIGS. 5-7 show several examples of how separate scan enable signals may be connected to sets of scan flip flops without considering design details for some or all of the scan flip flops in a design. That is, these implementations advantageously do not require knowledge of initiator logic or target logic in a given design.

FIG. 5 illustrates an example integrated circuit with DFT functionality including a first set of scan flip flops coupled to a first scan enable signal and a second set of scan flip flops coupled to a second scan enable signal in accordance with embodiments of the invention. The integrated circuit of FIG. 5 may be a specific implementation of other integrated circuits described herein such as the integrated circuit of FIG. 1, for example. Similarly labeled elements may be as previously described.

Referring to FIG. 5, an integrated circuit 500 includes a circuit under test 510, a first set of scan flip flops 511 and a second set of scan flip flops 512. Optionally, a controller 530 may be included in the integrated circuit 500 to drive the first scan enable signal 31 and the second scan enable signal 32 to test logic elements 526 of the circuit under test 510. Alternatively, test control may be entirely external. Similar to the integrated circuit 100 of FIG. 1, the first set of scan flip flops 511 are each coupled to the first scan enable signal 31 while the second set of scan flip flops 512 are each coupled to the second scan enable signal 32. However, unlike the integrated circuit 100, a first scan chain 521 includes scan flip flops from each set (e.g., the first scan chain 521 is a "mixed" scan chain).

While the first scan chain 521 could include all of the scan flip flops of both the first set of scan flip flops 511 and the second set of scan flip flops 512, it may also include a subset of each (as shown) reflecting the common occurrence that multiple scan chains are inserted. For example, a second scan chain 522 may include the some or all or the remaining scan flip flops of the first set of scan flip flops 511 and some or all of the remaining scan flip flops of the second set of scan flip flops 512, and so on.

One method of inserting scan chains in this manner, may be to insert scan chains with a single scan enable signal without considering the specifics of the design. Then, a script may be used to remove scan enable connections to some subset of the scan flip flops of the inserted scan chains according to some rule or rules and replace the connections with one or more additional scan enable signals. For example, adjacent scan flip flops throughout the design may be coupled to different scan enable signals (e.g., alternating between the first scan enable signal 31 and the second scan enable signal 32, as shown).

This allows the tool to use LOS launch with LOC capture when possible and to revert to conventional LOC otherwise (i.e. a mixture). In this way the timing requirements of conventional LOS are still advantageously avoided, while the pattern count is still reduced over purely conventional LOC because of the ability to use LOS launch with LOC capture some of the time. Since this method of connecting separate scan enable signals does not require any knowledge of the design, it may be beneficial for use in delivery devices and production cuts, for example.

FIG. 6 illustrates another example integrated circuit with DFT functionality including a first set of scan flip flops coupled to a first scan enable signal and a second set of scan flip flops coupled to a second scan enable signal where the integrated circuit includes a FIFO circuit in accordance with embodiments of the invention. The integrated circuit of FIG. 6 may be a specific implementation of other integrated circuits described herein such as the integrated circuit of FIG. 5, for example. Similarly labeled elements may be as previously described.

Referring to FIG. 6, an integrated circuit 600 includes a circuit under test 610 that includes a FIFO circuit with logic elements 626. Like the circuit under test 210 that also includes a FIFO circuit, the circuit under test 610 includes first scan chain 621 configured to write to the FIFO circuit (and read from the FIFO) and a second scan chain 622 that includes a shift register of the FIFO circuit.

However, unlike the circuit under test 210, the first scan enable signal 31 and the second scan enable signal 32 were connected to a first set of scan flip flops 611 and a second set of scan flip flops 612, respectively, with no knowledge of the underlying design. In this specific example, adjacent scan flip flops were coupled to different scan enable signals (e.g., alternating between the first scan enable signal 31 and the second scan enable signal 32, as shown).

FIG. 7 illustrates an example scan flip flop of an integrated circuit with DFT functionality where the scan flip flop has a localized scan enable in accordance with embodiments of the invention. The integrated circuit of FIG. 7 may be a specific implementation of other scan flip flops described herein and may be included in the integrated circuits described herein such as the integrated circuit of FIG. 1, for example. Similarly labeled elements may be as previously described.

Referring to FIG. 7, a scan flip flop 713 may be used in any of the sets of scan flip flops or scan chains included in the circuits under test of the integrated circuit described herein. As shown, a localized scan enable has been configured for the scan flip flop 713 using an OR gate 71 coupled to a test pin 74 (e.g. through scripts without considering the design). The localized scan enable may also avoid the stringent timing requirements of the scan enable path of conventional LOS by enabling a local LOS launching paradigm.

Figure 8:
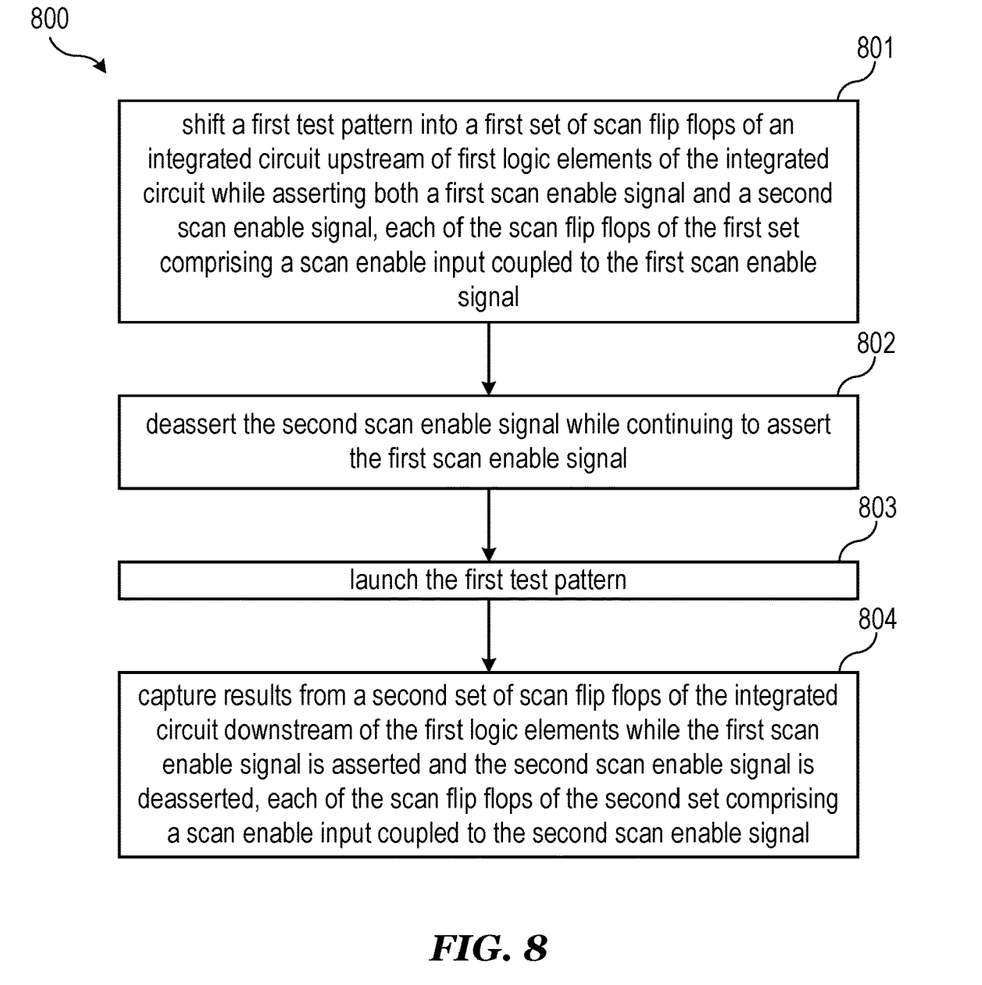
FIG. 8 illustrates an example method of testing an integrated circuit with DFT functionality including a first set of scan flip flops coupled to a first scan enable signal and a second set of scan flip flops coupled to a second scan enable signal in accordance with embodiments of the invention.

FIG. 8 illustrates an example method of testing an integrated circuit with DFT functionality including a first set of scan flip flops coupled to a first scan enable signal and a second set of scan flip flops coupled to a second scan enable signal in accordance with embodiments of the invention. The method of FIG. 8 may be combined with other methods and performed using the systems and apparatuses as described herein. For example, the method of FIG. 8 may be combined with any of the embodiments of FIGS. 1-7. Although shown in a logical order, the arrangement and numbering of the steps of FIG. 8 are not intended to be limited. The method steps of FIG. 8 may be performed in any suitable order or concurrently with one another as may be apparent to a person of skill in the art.

Referring to FIG. 8, a step 801 of a method 800 of testing an integrated circuit includes shifting a first test pattern into a first set of scan flip flops of the integrated circuit. The first set of scan flip flops are upstream of first logic elements of the integrated circuit. The shifting of the first test pattern is performed while asserting both a first scan enable signal and a second scan enable signal. Each of the scan flip flops of the first set include a scan enable input coupled to the first scan enable signal.

In step 802, the second scan enable signal is deasserted while continuing to assert the first scan enable signal. The first test pattern is launched in step 803. Then, in step 804, results are captured from a second set of scan flip flops of the integrated circuit. The second set of scan flip flops are downstream of the first logic elements. In contrast to the first set of scan flip flops which are coupled to the first scan enable signal, each of the scan flip flops of the second set include a scan enable input coupled to the second scan enable signal. The capturing of the results is performed while the first scan enable signal is asserted and the second scan enable signal is deasserted.

Example embodiments of the invention are summarized here. Other embodiments can also be understood from the entirety of the specification as well as the claims filed herein.

Example 1. An integrated circuit including: a first set of scan flip flops, each of the scan flip flops of the first set including a scan enable input coupled to a first scan enable signal; a circuit under test including logic elements downstream of the first set of scan flip flops; a second set of scan flip flops including at least one scan flip flop downstream of the logic elements, each of the scan flip flops of the second set including a scan enable input coupled to a second scan enable signal; and a controller configured to test the logic elements by shifting test patterns into the first set while asserting both the first scan enable signal and the second scan enable signal, launching the test patterns, and capturing results from the second set while continuing to assert the first scan enable signal and deasserting the second scan enable signal.

Example 2. The integrated circuit of example 1, where the first set of scan flip flops is a first scan chain, and where the second set of scan flip flops is a second scan chain that is separate from the first scan chain.

Example 3. The integrated circuit of one of examples 1 and 2, where the circuit under test includes a first in, first out (FIFO) circuit, where the scan flip flops of the first scan chain are configured to write to the FIFO circuit, and where the scan flip flops of the second scan chain include a shift register of the FIFO circuit.

Example 4. The integrated circuit of example 1, further including: a scan chain of scan flip flops including a subset of the first set and a subset of the second set, where the scan enable inputs of adjacent scan flip flops of the scan chain are coupled to different scan enable signals.

Example 5. The integrated circuit of one of examples 1 to 4, further including: a first test pin coupled to the first scan enable signal; and a second test pin coupled to the second scan enable signal.

Example 6. The integrated circuit of one of examples 1 to 4, where the controller is configured to simultaneously drive the first scan enable signal and the second scan enable signal to test the logic elements, the controller including a scan enable input, at least one controller scan flip flop, a first OR gate including a first input coupled to the scan enable input, and a second input coupled to the at least one controller scan flip flop, a first scan enable multiplexer including a first input coupled to the scan enable input, a second input coupled to the first OR gate, and an output coupled to the first scan enable signal, a second OR gate including a first input coupled to the scan enable input, and a second input coupled to the at least controller scan flip flop, a second scan enable multiplexer including a first input coupled to the scan enable signal, a second input coupled to the second OR gate, and an output coupled to the second scan enable signal.

Example 7. The integrated circuit of example 6, where the at least one controller scan flip flop includes a first controller scan flip flop coupled to the second input of the first OR gate, and a second controller scan flip flop coupled to the second input of the second OR gate.

Example 8. The integrated circuit of one of examples 6 and 7, where the at least one controller scan flip flop is a combined controller scan flip flop including an output coupled to both the second input of the first OR gate and to an inverter coupled to the second input of the second OR gate.

Example 9. The integrated circuit of one of examples 6 to 8, further including: a combined test pin coupled to the scan enable input of the controller.

Example 10. The integrated circuit of one of examples 6 to 9, further including: a logic built-in self-test circuit coupled to the scan enable input of the controller.

Example 11. The integrated circuit of one of examples 1 to 10, where the test patterns are combinational test patterns.

Example 12. The integrated circuit of one of examples 1 to 11, where shifting the test patterns uses test clock pulses, and where launching the test patterns and capturing the results uses two at-speed pulses.

Example 13. An integrated circuit including: a circuit under test including initiator logic elements and target logic elements; a first scan chain of scan flip flops including the initiator logic elements, each scan flip flop of the first scan chain including a scan enable input coupled to a first scan enable signal; a second scan chain of scan flip flops including the target logic elements, each of the scan flip flops of the second scan chain including a scan enable input coupled to a second scan enable signal; and a controller configured to test the circuit under test by shifting a first test pattern into the first scan chain while both the initiator logic elements and the target logic elements are operating in launch mode, launching the first test pattern, and capturing results from the second scan chain while the initiator logic elements are operating in launch mode and the target logic elements are operating in capture mode.

Example 14. The integrated circuit of example 13, where the circuit under test includes a first in, first out (FIFO) circuit, where the initiator logic elements are configured to write to the FIFO circuit, and where the target logic elements include a shift register of the FIFO circuit.

Example 15. The integrated circuit of one of examples 13 and 14, where the circuit under test includes a Joint Test Action Group (JTAG) state machine, where the initiator logic elements include a common shift data register, and where the target logic elements include multiple test data registers.

Example 16. The integrated circuit of one of examples 13 to 15, where the controller is further configured to test the circuit under test by shifting a second test pattern into the second scan chain while both the initiator logic elements and the target logic elements are operating in launch mode, launching the second test pattern, and capturing results from the first scan chain while the initiator logic elements are operating in capture mode and the target logic elements are operating in launch mode.

Example 17. The integrated circuit of example 16, where circuit under test includes a memory circuit, where the target logic elements include memory cells of the memory circuit, and where the initiator logic elements are configured to write to the memory cells during testing using the first test pattern and configured to read from the memory cells during testing using the second test pattern.

Example 18. The integrated circuit of one of examples 13 to 17, where shifting the first test pattern uses a test clock signal, and where launching the first test pattern and capturing the results uses two at-speed pulses.

Example 19. A method of testing an integrated circuit, the method including: shifting a first test pattern into a first set of scan flip flops of the integrated circuit upstream of first logic elements of the integrated circuit while asserting both a first scan enable signal and a second scan enable signal, each of the scan flip flops of the first set including a scan enable input coupled to the first scan enable signal; deasserting the second scan enable signal while continuing to assert the first scan enable signal; launching the first test pattern; and capturing results from a second set of scan flip flops of the integrated circuit downstream of the first logic elements while the first scan enable signal is asserted and the second scan enable signal is deasserted, each of the scan flip flops of the second set including a scan enable input coupled to the second scan enable signal.

Example 20. The method of example 19, where the first set of scan flip flops is a first scan chain, and where the second set of scan flip flops is a second scan chain that is separate from the first scan chain.

Example 21. The method of example 20, where the integrated circuit includes a first in, first out (FIFO) circuit, where the scan flip flops of the first scan chain are configured to write to the FIFO circuit, and where the scan flip flops of the second scan chain include a shift register of the FIFO circuit.

Example 22. The method of example 19, where the integrated circuit includes a scan chain of scan flip flops including a subset of the first set and a subset of the second set, where the scan enable inputs of adjacent scan flip flops of the scan chain are coupled to different scan enable signals.

Example 23. The method of one of examples 19 to 22, further including: shifting a second test pattern into the second set of scan flip flops while asserting both the first scan enable signal and the second scan enable signal, the second set of scan flip flops being upstream of second logic elements of the integrated circuit; deasserting the first scan enable signal while continuing to assert the second scan enable signal; launching the second test pattern and capturing results from the first set of scan flip flops while the first scan enable signal is deasserted and the second scan enable signal is asserted, the first set of scan flip flops being downstream of the second logic elements.

Example 24. The method of one of examples 19 to 23, where shifting the first test pattern uses a test clock signal, and where launching the first test pattern and capturing the results uses two at-speed pulses.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. An integrated circuit comprising:
    a first set of scan flip flops, each of the scan flip flops of the first set comprising a scan enable input coupled to a first scan enable signal;
    a circuit under test comprising logic elements downstream of the first set of scan flip flops;
    a second set of scan flip flops comprising at least one scan flip flop downstream of the logic elements, each of the scan flip flops of the second set comprising a scan enable input coupled to a second scan enable signal; and
    a controller configured to test the logic elements by
        shifting test patterns into the first set while simultaneously asserting both the first scan enable signal and the second scan enable signal,
        launching the test patterns, and
        capturing results from the second set while simultaneously continuing to assert the first scan enable signal and deasserting the second scan enable signal.

2. The integrated circuit of claim 1, wherein the first set of scan flip flops is a first scan chain, and wherein the second set of scan flip flops is a second scan chain that is separate from the first scan chain.

3. The integrated circuit of claim 1, wherein the circuit under test comprises a first in, first out (FIFO) circuit, wherein the scan flip flops of the first scan chain are configured to write to the FIFO circuit, and wherein the scan flip flops of the second scan chain comprise a shift register of the FIFO circuit.

4. The integrated circuit of claim 1, further comprising:
    a scan chain of scan flip flops comprising a subset of the first set and a subset of the second set, wherein the scan enable inputs of adjacent scan flip flops of the scan chain are coupled to different scan enable signals.

5. The integrated circuit of claim 1, further comprising:
    a first test pin coupled to the first scan enable signal; and
    a second test pin coupled to the second scan enable signal.

6. The integrated circuit of claim 1, wherein the controller is configured to simultaneously drive the first scan enable signal and the second scan enable signal to test the logic elements, the controller comprising
    a scan enable input,
    at least one controller scan flip flop,
    a first OR gate comprising a first input coupled to the scan enable input, and a second input coupled to the at least one controller scan flip flop,
    a first scan enable multiplexer comprising a first input coupled to the scan enable input, a second input coupled to the first OR gate, and an output coupled to the first scan enable signal,
    a second OR gate comprising a first input coupled to the scan enable input, and a second input coupled to the at least one controller scan flip flop,
    a second scan enable multiplexer comprising a first input coupled to the scan enable signal, a second input coupled to the second OR gate, and an output coupled to the second scan enable signal.

7. The integrated circuit of claim 6, wherein the at least one controller scan flip flop comprises a first controller scan flip flop coupled to the second input of the first OR gate, and a second controller scan flip flop coupled to the second input of the second OR gate.

8. The integrated circuit of claim 6, wherein the at least one controller scan flip flop is a combined controller scan flip flop comprising an output coupled to both the second input of the first OR gate and to an inverter coupled to the second input of the second OR gate.

9. The integrated circuit of claim 6, further comprising:
    a combined test pin coupled to the scan enable input of the controller.

10. The integrated circuit of claim 6, further comprising:
    a logic built-in self-test circuit coupled to the scan enable input of the controller.

11. An integrated circuit comprising:
    a circuit under test comprising initiator logic elements and target logic elements;
    a first scan chain of scan flip flops comprising the initiator logic elements, each scan flip flop of the first scan chain comprising a scan enable input coupled to a first scan enable signal;
    a second scan chain of scan flip flops comprising the target logic elements, each of the scan flip flops of the second scan chain comprising a scan enable input coupled to a second scan enable signal; and
    a controller configured to test the circuit under test by
        shifting a first test pattern into the first scan chain while both the initiator logic elements and the target logic elements are simultaneously operating in launch mode,
        launching the first test pattern, and
        capturing results from the second scan chain while the initiator logic elements are operating in launch mode simultaneously with the target logic elements operating in capture mode.

12. The integrated circuit of claim 11, wherein the circuit under test comprises a first in, first out (FIFO) circuit, wherein the initiator logic elements are configured to write to the FIFO circuit, and wherein the target logic elements comprise a shift register of the FIFO circuit.

13. The integrated circuit of claim 11, wherein the circuit under test comprises a Joint Test Action Group (JTAG) state machine, wherein the initiator logic elements comprise a common shift data register, and wherein the target logic elements comprise multiple test data registers.

14. The integrated circuit of claim 11, wherein the controller is further configured to test the circuit under test by
    shifting a second test pattern into the second scan chain while both the initiator logic elements and the target logic elements are operating in launch mode,
    launching the second test pattern, and
    capturing results from the first scan chain while the initiator logic elements are operating in capture mode and the target logic elements are operating in launch mode.

15. The integrated circuit of claim 14, wherein the circuit under test comprises a memory circuit, wherein the target logic elements comprise memory cells of the memory circuit, and wherein the initiator logic elements are configured to write to the memory cells during testing using the first test pattern and configured to read from the memory cells during testing using the second test pattern.

16. A method of testing an integrated circuit, the method comprising:
    shifting a first test pattern into a first set of scan flip flops of the integrated circuit upstream of first logic elements of the integrated circuit while simultaneously asserting both a first scan enable signal and a second scan enable signal, each of the scan flip flops of the first set comprising a scan enable input coupled to the first scan enable signal;

deasserting the second scan enable signal while continuing to assert the first scan enable signal;

launching the first test pattern; and capturing results from a second set of scan flip flops of the integrated circuit downstream of the first logic elements while the first scan enable signal is asserted simultaneously with the second scan enable signal being deasserted, each of the scan flip flops of the second set comprising a scan enable input coupled to the second scan enable signal.

17. The method of claim 16, wherein the first set of scan flip flops is a first scan chain, and wherein the second set of scan flip flops is a second scan chain that is separate from the first scan chain.

18. The method of claim 17, wherein the integrated circuit comprises a first in, first out (FIFO) circuit, wherein the scan flip flops of the first scan chain are configured to write to the FIFO circuit, and wherein the scan flip flops of the second scan chain comprise a shift register of the FIFO circuit.

19. The method of claim 16, wherein the integrated circuit comprises a scan chain of scan flip flops comprising a subset of the first set and a subset of the second set, wherein the scan enable inputs of adjacent scan flip flops of the scan chain are coupled to different scan enable signals.

20. The method of claim 16, further comprising:

shifting a second test pattern into the second set of scan flip flops while asserting both the first scan enable signal and the second scan enable signal, the second set of scan flip flops being upstream of second logic elements of the integrated circuit;

deasserting the first scan enable signal while continuing to assert the second scan enable signal; and launching the second test pattern and capturing results from the first set of scan flip flops while the first scan enable signal is deasserted and the second scan enable signal is asserted, the first set of scan flip flops being downstream of the second logic elements.

* * * * *